(12) United States Patent
Verheijden et al.

(10) Patent No.: US 8,273,653 B2
(45) Date of Patent: Sep. 25, 2012

(54) MICROSCOPIC STRUCTURE PACKAGING METHOD AND DEVICE WITH PACKAGED MICROSCOPIC STRUCTURE

(75) Inventors: Greja Johanna Adriana Maria Verheijden, Riethoven (NL); Roel Daamen, Herkenbosch (NL); Gerhard Koops, Aalst (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 293 days.

(21) Appl. No.: 12/477,798

(22) Filed: Jun. 3, 2009

(65) Prior Publication Data

US 2010/0006957 A1   Jan. 14, 2010

(30) Foreign Application Priority Data

Jun. 6, 2008   (EP) .................................. 08157785

(51) Int. Cl.
*H01L 21/00*   (2006.01)
(52) U.S. Cl. ........................................ 438/626; 438/694
(58) Field of Classification Search .................. 438/626, 438/694
See application file for complete search history.

(56) References Cited

U.S. PATENT DOCUMENTS

| | | | |
|---|---|---|---|
| 2006/0108652 A1* | 5/2006 | Partridge et al. | 257/414 |
| 2007/0020918 A1* | 1/2007 | Hirokawa et al. | 438/626 |
| 2009/0183992 A1* | 7/2009 | Fredenberg et al. | 205/82 |
| 2009/0205967 A1* | 8/2009 | Fredenberg et al. | 205/118 |
| 2009/0218233 A1* | 9/2009 | Fredenberg et al. | 205/223 |
| 2010/0006957 A1* | 1/2010 | Verheijden et al. | 257/415 |
| 2011/0175178 A1* | 7/2011 | van Wingerden et al. | 257/417 |

OTHER PUBLICATIONS

G.J.A.M. Verheijden et al., Wafer Level Encapsulation Technology for MEMS Devices using a HF-Permeable PECVD SIOC Capping Layer, MEMS 2008, IEEE 21st conference on Micro Electro Mechanical Systems 2008, pp. 798-801.

* cited by examiner

*Primary Examiner* — Laura Menz
(74) *Attorney, Agent, or Firm* — Haynes and Boone, LLP

(57) ABSTRACT

A method of packaging a micro electromechanical structure is disclosed. The method comprises the steps of forming the structure on a substrate, depositing a sacrificial layer over the structure, patterning the sacrificial layer, depositing a porous layer over the patterned sacrificial layer, removing the patterned sacrificial layer through the porous layer, treating the porous layer with a plasma and depositing a capping layer over the plasma-treated porous layer. The plasma treatment step ensures that the capping layer material cannot enter the cavity formed by the removal of the sacrificial layer through the porous layer. A device formed by this method is also disclosed.

18 Claims, 3 Drawing Sheets (a)

(b)

(c)

(d)

(e)

MICROSCOPIC STRUCTURE PACKAGING METHOD AND DEVICE WITH PACKAGED MICROSCOPIC STRUCTURE

CROSS REFERENCE

This application claims priority to European patent application number 08157785.0, filed Jun. 6, 2008, the disclosure of which is incorporated herein by reference.

FIELD OF THE INVENTION

The present invention relates to a method of packaging a microscopic structure. The present invention further related to a device comprising such a microscopic structure.

BACKGROUND OF THE INVENTION

The ongoing miniaturization of feature sizes in semiconductor manufacturing processes has facilitated the formation of microscopic structures, i.e. structures that have feature sizes in the micron and submicron, e.g. nanometer domain, on substrates such as silicon substrates. A prime example of such a microscopic structure is a microelectromechanical system (MEMS) structure. Such structures are sometimes also referred to as micromachines.

MEMS structures can be used for a wide range of applications in different fields of technology, e.g. electronics, medicine, pharmacy and chemistry. Applications in the filed of electronics for instance include accelerometers, gyroscopes, sensors, and so on. The MEMS structures may be made from any suitable material, e.g. silicon, polymer, metals amongst others.

Typically, the MEMS structure requires a certain degree of translational freedom in order to perform its function. To this end, the MEMS structure is packaged such that the structure is located in a cavity.

In the paper "Wafer Level Encapsulation Technology for MEMS Devices using a HF-Permeable PECVD SIOC Capping Layer" by G. J. A. M. Verheijden et al. in MEMS 2008, IEEE 21$^{st}$ conference on Micro Electro Mechanical Systems 2008, pages 798-801, a novel technology for the encapsulation of MEMS devices using a porous capping material is disclosed. The capping material consists of a low temperature PECVD layer of SiOC and is shown to be permeable to HF vapor and $H_2O$ and therefore allows for the removal of a $SiO_2$ sacrificial layer and the formation of a cavity underneath the capping layer, with the capping material being permeable enough to allow for the evacuation of the $SiO_2$ reaction products. The cavity underneath the capping layer allows for high-Q operation of a MEMS resonator. A sealing layer can be deposited on the capping layer without significantly contaminating the cavity. However, it has been found that residual contamination of the cavity is difficult to avoid, especially when a sealing layer consisting of relatively small molecules is formed.

US patent application No. 2006/0108652 A1 discloses a technique for manufacturing a MEMS device similar to the technology disclosed in the aforementioned paper, in which the residual contamination of the cavity upon deposition of the sealing layer is acknowledged. This contamination may be avoided by densifying the capping layer through an anneal step. However, such a step may cause damage to parts of the device that are intolerant to elevated temperatures.

SUMMARY

An embodiment of the present invention describes a method of packaging a MEMS structure on a substrate, in which contamination of the cavity including the MEMS structure is avoided without having to expose the substrate to excessive temperatures.

An embodiment of the present invention further seeks to provide a device comprising such a packaged MEMS structure.

In accordance with a first aspect of the present invention, there is provided a method of packaging a micro electromechanical structure comprising forming said structure on a substrate; depositing a sacrificial layer over said structure; patterning the sacrificial layer; depositing a porous layer over the patterned sacrificial layer; removing the patterned sacrificial layer through the porous layer; treating the porous layer with a plasma; and depositing a sealing layer over the plasma-treated porous layer.

The exposure of the porous layer to a plasma step ensures that the porous layer is (partly) densified, thus reducing the pore size of the porous material, which prevents access to the cavity in the subsequent processing steps, i.e. the deposition of the sealing layer over the porous layer to seal the cavity.

In a preferred embodiment, the method further comprises depositing a support layer over the sacrificial layer and patterning said support layer prior to depositing the porous layer. This provides the formed cavity with additional resilience, thus reducing the risk that mechanical forces on the cavity associated with subsequent processing steps cause damage to the cavity.

The porous layer may be a low-k dielectric layer such as a SiOC layer. Such materials have excellent insulating properties, which, when also being porous, makes these materials very suitable candidates for access to a sacrificial layer. The insulating property is an advantage to ensure that electrical interference between the MEMS device and the porous layer is avoided, because such interference is detrimental to the correct functioning of the MEMS device. The avoidance of such interference further facilitates a reduction of the cavity dimensions, which is beneficial in terms of structural integrity of the cavity.

The sacrificial layer may be any suitable sacrificial material such as a silicon oxide layer. Such a material may be removed by etching, e.g. HF-vapor. The etchant molecules must be small enough to be able to reach the sacrificial layer through the porous capping layer.

In accordance with another aspect of the present invention, there is provided a device comprising a substrate covered by a plasma-treated porous capping layer, a cavity including a micro electromechanical structure, said cavity being embedded in the capping layer; and a sealing layer covering the capping layer. Such a device benefits from a lack of sealing layer contamination in the cavity due to the fact that the plasma-treated porous effectively prevents the capping layer molecules accessing the cavity.

The device may further comprise a patterned support layer in between the cavity and the porous capping layer to provide additional strength to the cavity.

The capping layer may be a low-k dielectric material such as SiOC, which combines excellent insulating properties with a good pore size.

The sealing layer may be formed from any suitable material, such as SiGe.

BRIEF DESCRIPTION OF THE DRAWINGS

Embodiments of the invention are described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

DETAILED DESCRIPTION OF THE DRAWINGS

Figure 1:
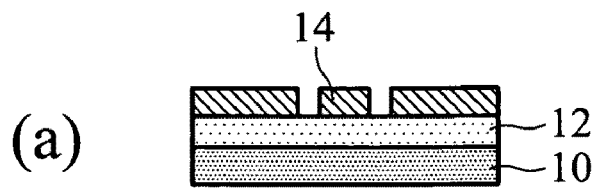
FIGS. 1a-f depict an embodiment of a method according to the present invention.
Figure 1:
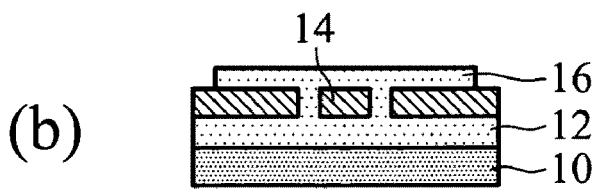
Figure 1:
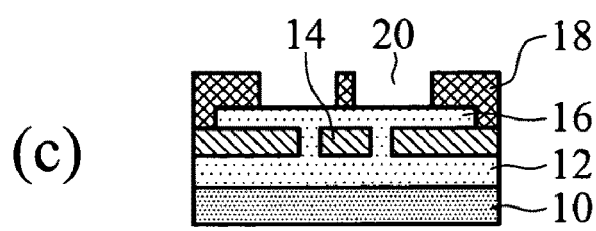
Figure 1:
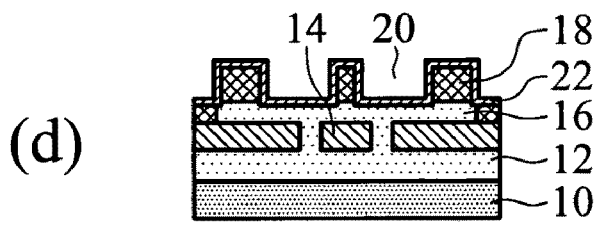
Figure 1:
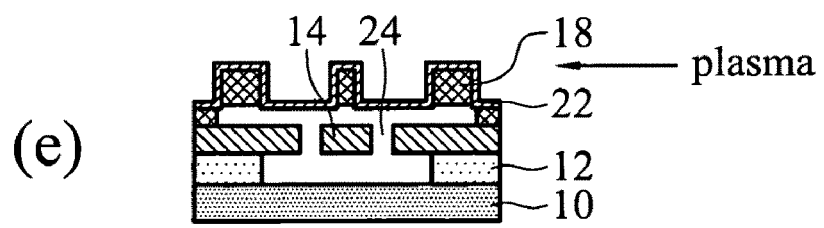
Figure 1:
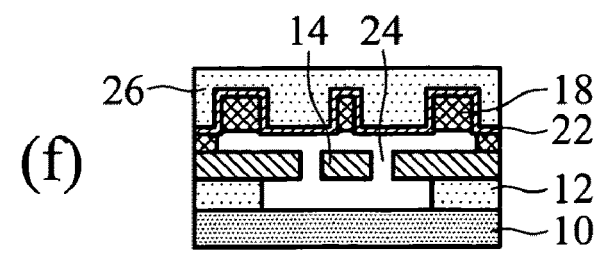

In FIG. 1a, a substrate 10 carrying a dielectric layer 12 is provided. The exact embodiments of the substrate 10 and the dielectric layer 12 are not essential to the present invention, and may therefore be any suitable substrate and dielectric layer. A MEMS device 14 is formed on the dielectric layer 12. The MEMS device 14 may be formed on the substrate 10 in any suitable way using any suitable material. In addition, the substrate 10 may be any suitable substrate such as a silicon substrate. The dielectric layer may be any suitable dielectric layer 12, such as a $SiO_2$ layer. The specific embodiments of the substrate 10, the dielectric layer 12 and the MEMS device 14 are not essential to the present invention. Alternatively, the dielectric layer 12 may be replaced by another type of layer or may be omitted altogether, in which case the MEMS device 14 may be formed directly on the substrate 10.

In a next step, as shown in FIG. 1B, a sacrificial material 16 is deposited over the MEMS device 14, and subsequently patterned, thereby yielding a structure that defines the shape of at least a part of a cavity to be formed around the MEMS device 14. In an embodiment, the sacrificial material is an oxide such as $SiO_2$, although other suitable materials may also be used. At this point, it is emphasized that the dielectric layer 12 may also be formed of a sacrificial material, or may at least comprise a sacrificial portion, which allows a cavity to be formed from both the sacrificial material 16 and a portion of the dielectric layer 12. The sacrificial material 16 may be deposited and patterned in any suitable way.

Next, as shown in FIG. 1c, a support layer 18 is deposited over the patterned sacrificial layer 16 and subsequently patterned such that the support layer 18 comprises trenches or holes 20 for allowing the sacrificial material 16 to escape through the support layer 18. The support layer 18 may be deposited using any suitable deposition technique, e.g. CVD, PE-CVD, PVD and so on, and may for instance be a SiC and SiGe layer. The patterning of the support layer 18 may for instance be realized by etching. When etching the support layer 18, care has to be taken that an etchant is chosen that will not cause delamination of the porous layer to be formed. Any $SiO_2$ formed during the deposition of the support layer 18 should preferably be removed prior to the deposition of the porous layer to ensure a good quality interface between the support layer 18 and the porous layer.

Subsequently, as shown in FIG. 1d, the patterned support layer 18 is covered by a porous capping layer 22 having a pore size that is sufficient to allow an etchant to reach the patterned sacrificial layer 16 through the pores of the porous capping layer 22. Preferably, the porous capping layer 22 is a SiOC layer deposited by means of plasma-enhanced chemical vapor deposition (PE-CVD) because such a process step can be performed at a relatively low temperature, e.g. 350° C., which allows deposition of the material on standard CMOS wafers in the back end of the processing line. An example of a suitable SiOC material is Black Diamond™ marketed by Applied Materials™, which has a porosity of around 7%. Other suitable porous materials may also be used. The porous capping layer 22 covers the trenches 20, with the pores of the porous capping layer 22 in the trenches 20 forming access channels to the sacrificial material 16.

FIG. 1e shows the next steps of the embodiment of the method of the present invention. First, the sacrificial material 16, and optionally, a part of the dielectric layer 12, is removed by exposing the substrate stack to a wet or a dry etch, which can penetrate the porous capping layer 22. A non-limiting example of such an etchant is vapor-HF or an aqueous HF solution. For instance, the substrate stack may be exposed to a vapor-HF etch for 30 minutes at 35° C. This has the effect that all sacrificial material 16 is effectively removed, thereby forming a cavity 24 under the porous capping layer 22 and the support layer 18.

Following the removal of the sacrificial material 16 through the pores of the capping layer 22, the porous capping layer 22 is treated, i.e. cleaned with a plasma, which densifies the porous capping layer 22, thus reducing the pore size of the porous capping layer 22. Non-limiting examples of such a plasma include $O_2$ and He. Such a plasma may be generated in a DRIE-etching chamber, a CVD system, a PE-CVD system, and may be generated at reduced pressures. Preferably, the plasma is generated using the same system used to deposit a subsequent sealing layer.

In a final step shown in FIG. 1f, the cavity 24 is sealed by the deposition of a hermetic capping or sealing layer 26, which itself is prevented from penetrating the cavity 24 due to the densification of the porous capping layer 22. Such a layer may for instance be deposited using CVD, PE-CVD or PVD techniques. Other suitable techniques will be apparent to the skilled person. Hence, a MEMS device 14 in a cavity 24 is provided that is not detrimentally affected by residual sealing material entering the cavity 24 in the sealing step. Any suitable sealing material may be used, such as SiGe, SiN, SiO2, SiC or a metal layer.

Figure 2:
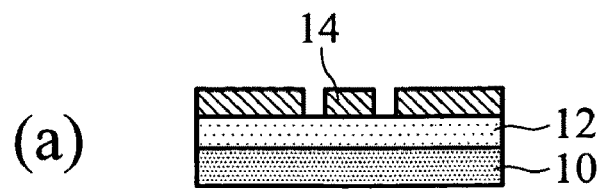
FIGS. 2a-e depict another embodiment of a method according to the present invention.
Figure 2:
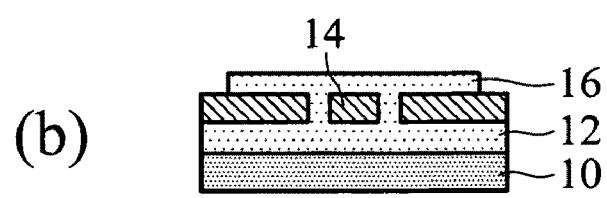
Figure 2:
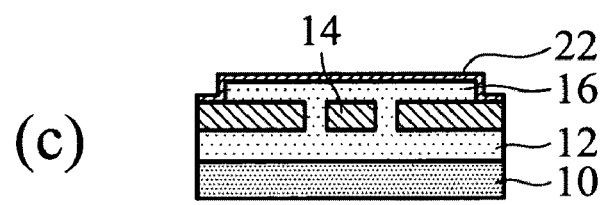
Figure 2:
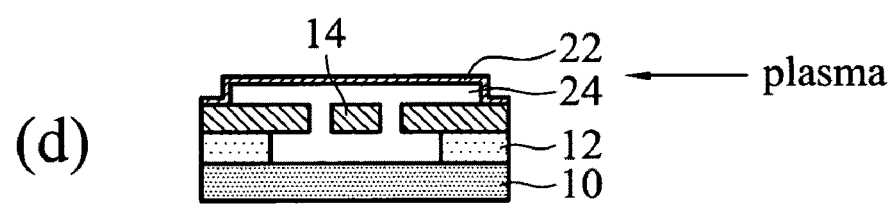
Figure 2:
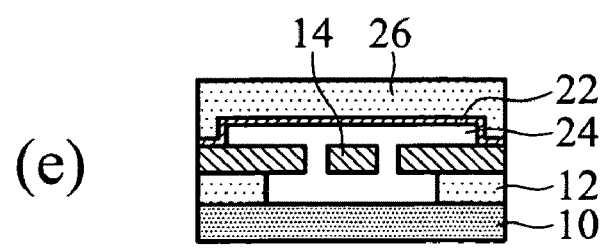

FIG. 2 shows an alternative embodiment of the method of the present invention, in which the steps shown in FIG. 2a and 2b are identical to the steps shown in FIG. 1a and FIG. 1b. However, the deposition of a support layer 18 is omitted, and the porous capping layer 22 is deposited directly over the patterned sacrificial layer 16. This has the advantage that a larger surface area of the patterned sacrificial layer 16 is covered by the porous capping layer 22, thus allowing for a quicker removal of the patterned sacrificial layer 16. Moreover, it obviates the need to form the trenches 20 by means of an additional mask step.

The steps in FIG. 2d and FIG. 2e correspond with the steps in FIG. 1e and FIG. 1f respectively, in which the patterned sacrificial layer 16 is removed by means of etching though the pores of the porous capping layer 22, thereby forming the cavity 24 including the MEMS device 14 followed by the densifying of the porous capping layer 22 by means of a plasma treatment and the subsequent deposition of the sealing layer 26 over the densified capping layer 22.

Figure 3:
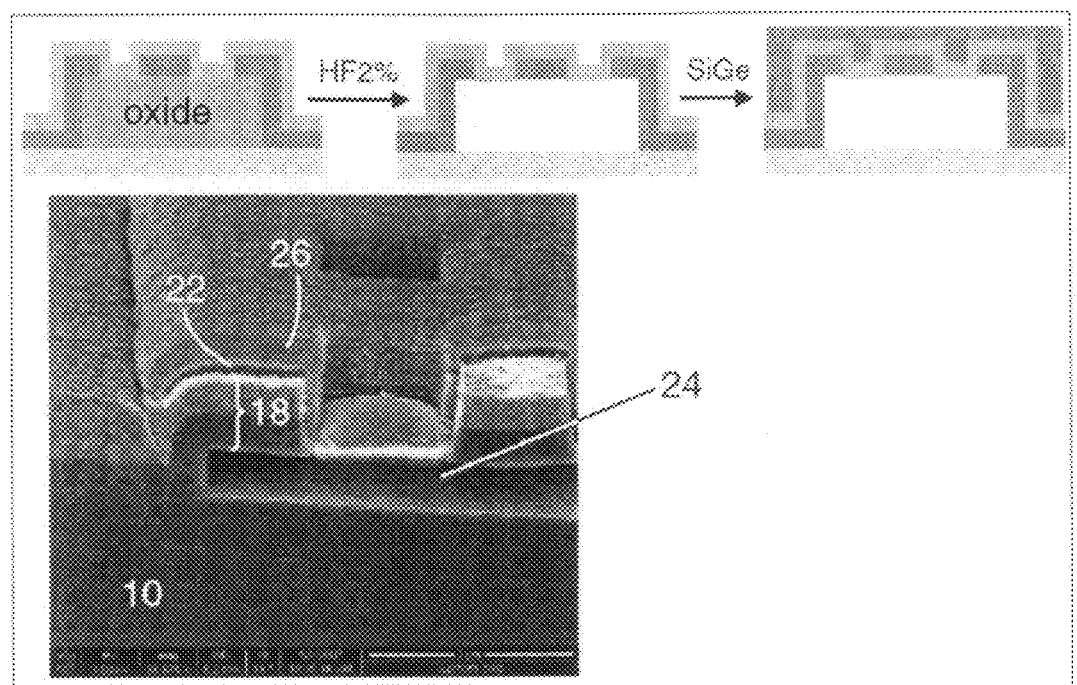
FIG. 3 depicts a scanning electron microscope (SEM) image of a cavity formed by a method according to an embodiment of the present invention.

FIG. 3 depicts a SEM image of a cross-section of a device formed in accordance with the embodiment of the inventive method depicted in FIG. 1a-f, in which a fortified Black Diamond™ porous SiOC capping layer 22 is sealed with a SiGe sealing layer 26. As indicated by the arrow 24, a cavity is formed under the sealing layer 26 and the fortified capping layer 18 that is substantially free of contaminants.

Figure 4:
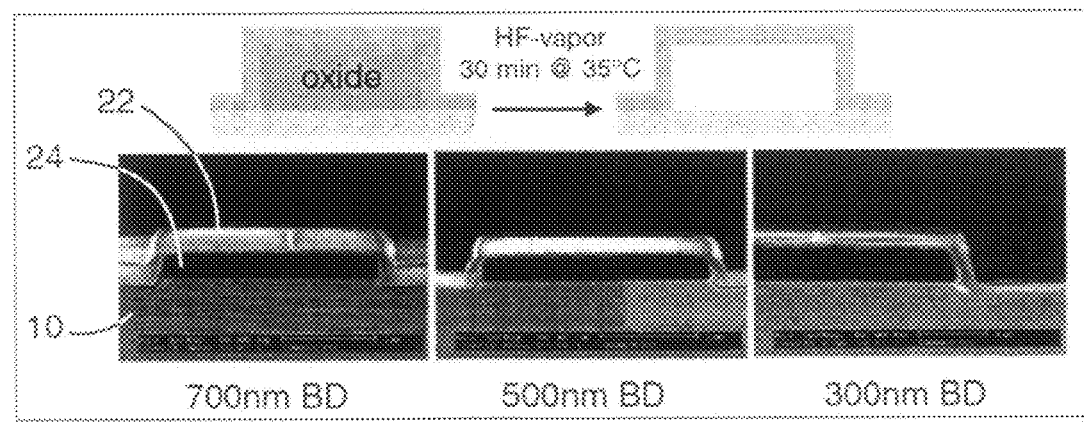
FIG. 4 depicts a SEM image of a cavity formed by a method according to another embodiment of the present invention.

FIG. 4 depicts a SEM image of a cross-section of a device formed in accordance with the embodiment of the inventive method depicted in FIG. 2, and in particular after the process step depicted in FIG. 2d. A Black Diamond™ porous SiOC capping layer 22 is used, having a thickness of 700 nm, 500 nm and 300 nm from left to right. It is clearly demonstrated that a cavity 24 can be effectively formed under the porous capping layer 22. In this embodiment, care has to be taken that the porous capping layer 22 has a sufficient thickness to withstand the mechanical forces exerted on the porous capping layer 22 in subsequent processing steps, such as the deposition step of the sealing layer 26. However, it is demonstrated that a relatively thick porous capping layer 22, e.g. a layer having a 700 nm thickness, is still suitable for the complete removal of the sacrificial material 16.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of packaging a micro electro-mechanical structure comprising:
    forming said structure on a substrate;
    depositing a sacrificial layer over said structure;
    patterning the sacrificial layer;
    depositing a porous layer over the patterned sacrificial layer, the porous layer having a pore size;
    removing the patterned sacrificial layer through the porous layer;
    treating the porous layer with a plasma cleaning to densify the porous layer by reducing the pore size of the porous layer; and
    depositing a capping layer over the plasma-treated porous layer.

2. The method according to claim 1, further comprising depositing a support layer over the sacrificial layer and patterning said support layer prior to depositing the porous layer.

3. The method according to claim 1, wherein the porous layer is a low-k dielectric layer.

4. The method according to claim 3, wherein the porous layer is a SiOC layer.

5. The method according to claim 1, wherein the sacrificial layer is a silicon oxide layer.

6. The method according to claim 5, wherein said removing step is performed by etching.

7. The method according to claim 6, wherein said etching is performed using hydrogen fluoride.

8. A method comprising:
    providing a substrate;
    forming a sacrificial layer over the substrate, the sacrificial layer including a cavity;
    forming a first capping layer over the sacrificial layer and the cavity, the capping layer including a plurality of pores of sufficient size to allow a later-applied etchant to reach the sacrificial layer;
    removing at least a portion of the sacrificial layer by applying the etchant through the pores of the first capping layer;
    treating the first capping layer after removal of the sacrificial layer portion to reduce the size of the pores, wherein treating the first capping layer includes treating with a plasma cleaning that densifies the porous layer; and
    forming a second capping layer over the treated first capping layer.

9. The method of claim 8 wherein treating the first capping layer includes performing a plasma cleaning process.

10. The method of claim 8, wherein the first capping layer is a SiOC layer deposited by plasma-enhanced chemical vapor deposition.

11. The method of claim 8 further comprising:
    providing a dielectric layer over the substrate, wherein the sacrificial layer is formed over the dielectric layer.

12. The method of claim 8 further comprising:
    providing a support layer over the sacrificial layer, wherein the first capping layer is formed over the support layer.

13. The method of claim 12 further comprising:
    patterning the support layer to form one or more holes through which the sacrificial layer may escape during the removal step.

14. The method of claim 12 wherein the support layer is provided via a deposition process that further produces a by-product material above the support layer, the method further comprising:
    removing the by-product material prior to forming the first capping layer.

15. The method of claim 14, wherein the sacrificial layer includes SiO2 and the by-product material is SiO2.

16. A method of making a micro electro-mechanical structure comprising:
    providing a Si substrate with a SiO2 dielectric layer;
    forming a SiO2 sacrificial layer over the substrate;
    patterning the SiO2 sacrificial layer to form a cavity;
    depositing a SiC and SiGe support layer over the patterned SiO2 sacrificial layer;
    patterning the SiC and SiGe support layer to form holes for allowing material from the sacrificial layer to escape through the support layer;
    removing SiO2 material formed during the deposition of the support layer prior to the deposition of a porous SiOC capping layer;
    covering, at least a portion, of the patterned support layer with the porous SiOC capping layer having a pore size that is sufficient to allow an etchant to reach the patterned sacrificial layer, the porous SiOC capping layer being formed by plasma-enhanced chemical vapor deposition (PE-CVD);
    removing the sacrificial layer and a part of the SiO2 dielectric layer by applying an etchant that can penetrate the porous SiOC capping layer;
    following the removal of the sacrificial layer, cleaning the porous SiOC capping layer with a plasma process to densify the porous capping layer and reduce the pore size;
    depositing a hermetic capping layer, which is prevented from penetrating the cavity due to the densification of the porous capping layer;
    wherein a common plasma system is used to clean the porous SiOC capping layer and to deposit the hermetic capping layer.

17. The method of claim 16, wherein the hermetic capping layer is a metal layer.

18. The method of claim 16, wherein the hermetic capping layer is from the group consisting of SiGe, SiN, SiO2, and SiC.

* * * * *